(12) United States Patent
Kalynushkin et al.

(10) Patent No.: US 7,208,195 B2
(45) Date of Patent: Apr. 24, 2007

(54) METHODS AND APPARATUS FOR DEPOSITION OF THIN FILMS

(75) Inventors: Yevgen Kalynushkin, Dnepropetrovsk (UA); Elena Shembel, Ft. Lauderdale, FL (US); Peter Novak, Antwerp (BE); Chris Flury, Crans (CH)

(73) Assignee: Ener1Group, Inc., Ft. Lauderdale, FL (US)

( * ) Notice: Subject to any disclaimer, the term of this patent is extended or adjusted under 35 U.S.C. 154(b) by 0 days.

(21) Appl. No.: 10/108,140

(22) Filed: Mar. 27, 2002

(65) Prior Publication Data

US 2003/0185977 A1    Oct. 2, 2003

(51) Int. Cl.
    *C23C 16/00*    (2006.01)

(52) U.S. Cl. .............. 427/248.1; 427/255.23; 427/255.28; 427/255.29; 427/255.31; 427/255.32; 427/255.393; 427/255.395; 427/255.7

(58) Field of Classification Search ............. 427/248.1, 427/255.23, 255.28, 255.29, 255.31, 255.32–255.393, 427/255.395, 255.7
See application file for complete search history.

(56) References Cited

U.S. PATENT DOCUMENTS

| | | | | |
|---|---|---|---|---|
| 3,640,689 | A * | 2/1972 | Glaski et al. ............... | 428/627 |
| 4,436,862 | A * | 3/1984 | Tetenbaum et al. ......... | 524/445 |
| 4,555,456 | A * | 11/1985 | Kanehori et al. ........... | 429/131 |
| 4,715,875 | A * | 12/1987 | Jacobson ..................... | 65/417 |
| 4,949,783 | A * | 8/1990 | Lakios et al. ............... | 165/80.1 |
| 5,591,486 | A * | 1/1997 | Okano et al. .......... | 427/255.28 |
| 5,804,259 | A * | 9/1998 | Robles ........................ | 427/577 |
| 6,040,017 | A * | 3/2000 | Mikhael et al. ............. | 427/496 |
| 6,045,864 | A * | 4/2000 | Lyons et al. ........... | 427/255.23 |
| 6,355,376 | B1 | 3/2002 | Meunier | |
| 6,432,281 | B2 * | 8/2002 | Vanden Brande et al. ..................... | 204/192.15 |
| 6,468,595 | B1 * | 10/2002 | Mikhael et al. ............. | 427/497 |
| 2002/0081447 | A1 * | 6/2002 | Movchan et al. ........... | 428/469 |
| 2002/0086521 | A1 * | 7/2002 | Ahn et al. ................... | 438/630 |
| 2003/0054099 | A1 * | 3/2003 | Jurgensen et al. ....... | 427/248.1 |

FOREIGN PATENT DOCUMENTS

| WO | 01/61071 A | 8/2001 |
|---|---|---|
| WO | WO 01/61071 A2 | 8/2001 |

* cited by examiner

*Primary Examiner*—Timothy Meeks
*Assistant Examiner*—Kelly Stouffer
(74) *Attorney, Agent, or Firm*—Howard & Howard Attorneys, P.C.

(57) ABSTRACT

A method for depositing a thin film includes the steps of providing a vapor including at least one selected vapor phase component into an evacuated chamber and condensing the vapor onto a heated substrate to form a liquid phase deposit wherein a temperature of the substrate is lower than the condensation temperature of the component. The liquid deposit is then cooled to produce a solid phase film. The invention can provide two or more vapor phase components. The invention can be used to deposit a wide variety of layers, including thin films of metallic, semiconductor and nonmetallic inorganic materials. The invention is useful for forming solid electrolytes and the electrodes for batteries, fuel cells and other electromagnetically active devices.

27 Claims, 18 Drawing Sheets

Schematic showing a system for the deposition of thin films using vapor condensation, according to an embodiment of the invention.

Schematic showing a system for the deposition of thin films using vapor condensation, according to an embodiment of the invention.

Temperature regime of evaporation solid electrolytes.

Schematic diagram illustrated the thermodynamic conditions
for vapor condensation on the substrate The dependence of the specific electronic resistivity of a battery system aluminum-solid electrolyte-stainless as a function of defects in the electrolyte film The structure of the film of system $Li_2O$-$Li_2SO_4$-$B_2O_3$ obtained according to the procedure described in Example 1

Fine crystalline structure of the film obtained according to the procedure described in example 4.

X-ray structural analysis of thin film of $Li_2O$-$Li_2SO_4$-$B_2O_3$ having amorphous crystalline structure.

SEM image of the structure of a surface with mechanically deposited particles of a powder of $(LiF)_2$-$Li_2WO_4$-$P_2O_5$ described in Example 8, x 600

The structure of a film of $(LiF)_2$-$Li_2WO_4$-$P_2O_5$ deposited on a substrate with the crystalline powder described in Example 9.

The temperature profile of an evaporation device during evaporation of MoO₃ powder The structure of a MoO$_3$ film with a considerable amount of defoliation sections deposited according to the procedure described in Example 10.

X-ray structural analysis of a thin $MoO_3$ film deposited according to the procedure described in Example 11

The spalling structure of a MoO₃ film deposited according to the procedure described in Example 11

X-ray structural analysis of a thin MoO₃ film deposited according to the procedure described in Example 12

The structure of a MoO$_3$ film without spalling deposited according to the procedure described in Example 12

X40000

The fine structure of a $MoO_3$ film deposited according to the procedure described in Example 12

METHODS AND APPARATUS FOR DEPOSITION OF THIN FILMS

CROSS REFERENCE TO RELATED APPLICATION

Not applicable.

STATEMENT AS TO FEDERALLY SPONSORED RESEARCH

Not applicable.

FIELD OF THE INVENTION

The invention concerns methods and apparatus for depositing uniform thin films using vapor condensation.

BACKGROUND OF THE INVENTION

Thin films are important in the manufacture of electronic active devices, such as microelectronics, batteries and fuel cells. In the case of batteries, appropriate thin films can be used to form batteries having low internal series resistance, high capacity and other specific properties required of modern batteries. However, despite continuing improvements in thin film deposition methods, there has been limited success in the manufacture of thin (i.e., <10 μm) homogeneous films. Depending on the film material, available film deposition methods may be expensive, provide an insufficient deposition rate or fail to provide homogeneous films.

A known vacuum method for the production of thin films is laser sputtering. However, this method is generally not suitable for the production of thin films for thickness below approximately 10 μm because of difficulties in achieving homogeneity and structural uniformity for thickness below this value.

Thin films used in batteries are commonly provided by vacuum deposition methods. Other methods, such as mechanical or non-vacuum chemical deposition, can also provide thin films of various types, but these films have certain properties rendering them generally unsuitable for use in batteries or fuel cells. During these deposition process, substantial changes in the chemical or phase structure of the film can occur, resulting in a film having properties which may differ significantly from the initially deposited material. In most cases, these changes are unpredictable and adversely affect resulting film properties.

Different methods for the production of thin films for batteries have been developed. Most efforts have focused on attempts to develop thin, flat, small-area batteries, the batteries having low internal series resistance. Attempts to develop films for batteries having low electronic conductivity and high ionic conductivity have prompted research to develop suitable thin films for use as solid electrolytes and cathodes for high performance batteries, such as Li metal or lithium ion batteries. Solid electrolytes, as well as electrode materials, generally require a high degree of surface purity. In addition, batteries require good electrode/electrolyte contacts.

The above difficulties have been solved in part by a method disclosed by U.S. Pat. No. 6,132,653 to Hunt, et al. Hunt discloses an atmospheric method for chemical vapor deposition (CVD) using a very fine atomization or vaporization of a reagent containing liquid or liquid-like fluid near its supercritical temperature. The resulting atomized or vaporized solution is entered into a flame or a plasma torch, and a powder is formed or a coating is deposited onto a substrate. While the use of the plasma flame described by Hunt can produce nanocrystal powders for several metals and oxides, the method cannot be applied to production of vitreous complex solid electrolytes or to produce layers with a thickness below approximately 10 μm for most applications because the resulting films generally lack uniformity of thickness. Moreover, the disclosed method can result in trapping foreign materials in the film and partial oxidation of the material.

Some current vacuum methods include DC and RF magnetron sputtering, thermal sputtering and molecular beam deposition. The preferred method generally depends on the desired chemical and physical properties of the material, the thickness of the film, and the deposition rate. Using molecular beam techniques, thin dense films from a broad group of materials have been prepared. Films prepared by these procedures have been used in batteries. However, these methods are generally characterized by low deposition rates, the need for ultrahigh vacuum, and difficulty in obtaining RF sputtering targets and for deposition of films having complex compositions.

Regarding batteries utilizing solid electrolytes, minimizing the thickness of solid electrolytes helps reduce the internal series resistance of the battery. However, although films of solid electrolytes having a thickness below 1 μm can be used to produce batteries having low internal resistance, internal short circuits (e.g. from Li dendrites) tend to develop, particularly when the films have large surface areas. In practice films with a minimum thickness of approximately 10–20 μm are used because of technical difficulties in achieving a sufficient structural homogeneity to reduce the battery size. Additionally, expense can be a concern due to the cost of providing certain conventional solid electrolyte materials.

Thus, lack of structural homogeneity can limit the use of available thin film sputtering processes for the production of thin films for batteries. The methods are generally only suitable for production of thin films for superionic conductors having simple stoichiometries. For more complex films, the use of these techniques is generally further limited by a low deposition rate.

Although vacuum thermal sputtering can generally provide up to a 1000 fold increase in deposition rate compared to magnetron and molecular sputtering, thermal sputtering generally produces films having lower density, degraded homogeneity and adhesion to substrates compared to these related methods. The adhesion of the deposited layer to substrates can generally be improved by raising the temperature of the substrate, but can lead to structural changes in the deposited layer, such as increased grain size.

The above limitations of thermal vacuum sputtering result mainly because the process is performed under high vacuum which results in low vapor density and the process uses low energy sputtered particles (below 1 eV). As a result, non-homogenous films are generally formed. Attempts to increase film homogeneity by increasing reactor size, or by increasing the evaporation temperature have been generally unsuccessful, as they lower the deposition efficiency and result in certain system inefficiencies, such as requiring more frequent replacement of the evaporating device.

Accordingly, there is therefore a need for new methods of preparing thin films, particularly films having thicknesses of less than about 50 μl, that are efficiently deposited as homogenous layers substantially free of foreign materials. The deposited layers should provide physical and chemical properties required for efficient function in batteries, fuel cells and other electronic active devices.

SUMMARY OF THE INVENTION

A method for depositing a thin film, includes providing a vapor including at least one selected vapor phase component into an evacuated process chamber, condensing the vapor onto a heated substrate to form a liquid phase deposit, wherein a temperature of the substrate is lower than the condensation temperature of the component. To avoid solid phase deposition occurring directly from the vapor, the substrate temperature is preferably held at a temperature which is also higher than the sublimation temperature of the component, as defined herein. The liquid deposit is then cooled to form a solid phase film.

As used herein, the term sublimation temperature refers to the maximum temperature in which a solid phase deposit can directly result from the corresponding vapor of the component. The condensation temperature refers to the maximum temperature of actual liquid phase formation from the vapor of the component. These respective values are related to the values determined experimentally under non-equilibrium conditions which may differ from the corresponding equilibrium values which may be shown in calculated phase diagrams.

The providing step can comprise evaporation. In this embodiment, the evaporating step can include utilizing a plurality of evaporation sources. The evaporation sources can be operated at different temperatures.

The substrate is preferably a metallic or ceramic substrate. The method can further include the step of cleaning the surface of the substrate surface prior to the providing step. The method also include the step of holding a temperature of the process chamber above a sublimation temperature of the component.

The method can include the step of varying the volume of the process chamber. The varying step can include reducing the process chamber volume prior to or during the condensing step. The varying step can include increasing the volume of the process chamber prior to or during the cooling step.

The method can comprise multi-step cycling. In this embodiment, only a portion of the thickness of the solid phase film is deposited in each of a plurality of cycles, each cycle including providing, condensing and cooling steps. Some cycles can use at least one material chemically distinct from the component to produce multi-component materials having a plurality of different layers.

The solid phase film can include a second layer disposed on a first layer, the first and second layers being chemically distinct. The first layer can be a cathode layer and the second layer can be a solid electrolyte layer. The solid phase film can be a eutectic composition, the eutectic composition including a plurality of components.

The providing step can include melting a plurality of components to form a homogeneous material and evaporating the homogeneous material to form a solid phase eutectic film. The method can further include the step of grinding the homogeneous material prior to the evaporating step. The plurality of components can also be stirred.

The cooling step can comprise active cooling or forced gaseous cooling. The method can include the step of introducing at least one additional gaseous component into the process chamber during the evaporating step.

The solid phase film formed can be used as an electrolyte or an electrode for a battery or for fuel cells and other electromagnetically active devices. The solid phase films can comprise oxides, borides, sulfides and fluorides.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION OF THE PREFERRED EMBODIMENTS

Figure 1:
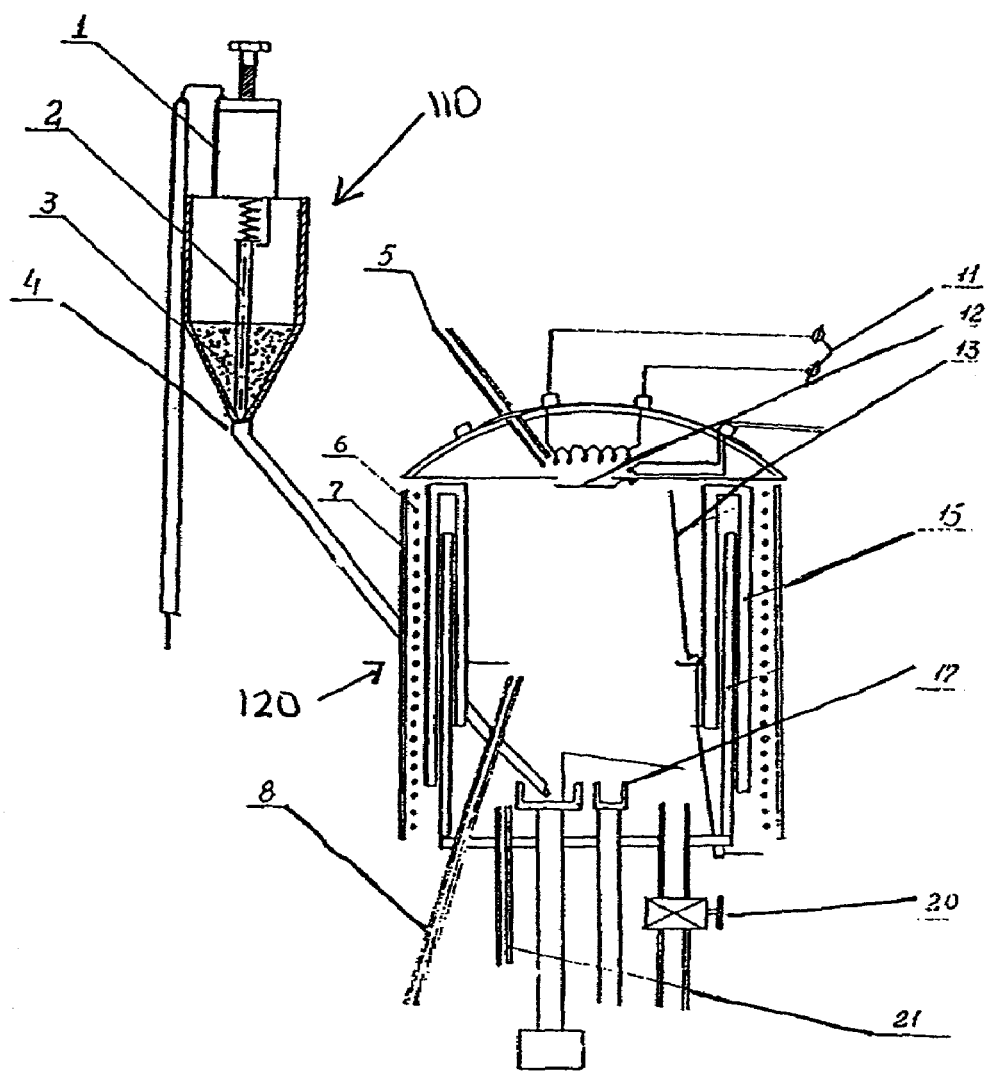
FIG. 1. illustrates a system for the deposition of thin films using vapor condensation, according to an embodiment of the invention.

The invention substantially addresses deficiencies in current processes used for the deposition of thin films, particularly for thin films having thicknesses of less than about 20 µm. The invention can provide thin films having a high degree of homogeneity with respect to chemical composition, structure and thickness. In addition, the invention can produce films which adhere well to a variety of substrates. The invention can also provide a high deposition rate.

In one embodiment of the invention, a method for depositing a thin film includes the steps of providing a vapor including at least one selected vapor phase component into a substantially evacuated processing chamber. The vapor is condensed onto a heated substrate to form a liquid phase deposit by holding the temperature of the substrate lower than the condensation temperature of the component, but higher than the sublimation temperature of the vapor phase component. As used herein, the term sublimation temperature refers to the maximum temperature in which a solid phase deposit can directly result from the corresponding vapor of the component. The liquid component is then cooled to form a solid phase film of the desired material.

Under the above conditions, the vapor material is deposited on the substrate not as a solid film, as in conventional thermal sputtering, but as a liquid film of substantially constant thickness, depending on the wetability of the substrate surface. This ensures good adhesion to the substrate, low porosity and uniform thickness of the deposit. After cooling, the liquid deposit solidifies.

The invention permits deposition of thin films without chemically altering the source material. Although the invention can be used with a single source material, the invention can provide two or more vapor phase components, such as co-evaporation of at least two reagent sources to form a plurality of vapor phase components, and condensation of the same onto a substrate. The condensed reagent components can react in the liquid phase on the substrate surface following condensation. This process is shown in Example 14.

The invention is applicable to deposit a wide variety of layers, including thin films of metallic, semiconductor and nonmetallic inorganic materials. The invention is also useful for forming solid electrolytes and electrodes for batteries. In addition, films formed using the invention can be used for fuel cells and other electromagnetically active devices.

The invention requires that at least one vapor be provided in the process chamber. Evaporation of solid source materials can be used to provide a vapor. For more complex desired compositions, such as the formation of eutectic electrolytes having a plurality of components, individual components in a suitable molar ratio in solid form can be placed into a heating device, such as a furnace, for melting. The melt is preferably stirred. Stirring may be provided by a cavitational stirring device. The liquid material can be dispensed onto a solid surface and cooled to obtain particles having the desired eutectic composition. The particles can then be ground to a size preferably being less than 100 µm to form a powder suitable for evaporation. Regardless of the source of the vapor, the vapor is condensed on a heated substrate to form a liquid phase deposit by holding the temperature of the substrate at a temperature lower than the condensation temperature of the vapor phase component.

It is preferable to hold the process chamber walls at a temperature sufficient to avoid deposition thereon, because deposition of evaporated material on the reactor chamber walls can lower the deposition rate on the substrate and can lead to particulate inclusion in the deposited layer. For example, flaking of films deposited on the process chamber walls can result in particulate incorporation in the deposited film. Thus, respective temperatures of the process chamber and substrate are preferably selected to condense liquid on the substrate, but not on the process chamber walls. For this purpose, the temperature of chambers walls are maintained at a value above the condensation temperature of the vapor, while the substrate is maintained at a temperature below the condensation temperature of the vapor.

The deposit spreads uniformly over the whole substrate surface under the influence of the surface tension of the deposited liquid. The deposited liquid is then cooled to form a substantially homogeneous solid thin film layer.

The resulting structure of the solid film formed depends on the cooling rate of the deposited liquid. Selected cooling rates depend on the particular material as well as the intended use of the material. As the cooling rate increases, the structure of the deposited layer generally changes from crystalline to microcrystalline (polycrystalline) to amorphous-crystalline to amorphous. The term amorphous-crystalline as used herein refers to a structure having localized small crystallites disposed in a substantially amorphous matrix.

Microcrystalline and amorphous-crystalline structures generally exhibit a high degree of uniformity in chemical composition and also good electrochemical properties, such as ionic conductivity and electrochemical activity. Electrochemical properties of films of cathode materials based on molybdenum oxide, and solid electrolytes based on eutectic oxide and sulfide systems, have shown high values of cathode specific energy and electrolyte conductivity when the films have microcrystalline and amorphous-crystalline structures, respectively. The invention can be used to deposit thick and multilayer films to provide electrode and electrolyte materials for batteries including an electrode layer disposed on an electrolyte layer.

FIG. 1 shows a system 100 adapted for depositing uniform thin films using vapor condensation. System 100 can include a dosing device 110, a process chamber 120 having an adjustable working chamber volume and a valve 20 permitting isolation of the substrate from other parts of the working chamber. A decrease in the volume of the working chamber during the evaporation/condensation process can increase the vapor density and the rate of condensation of vapor on the substrate. After the evaporation/condensation process is complete, a subsequent volume increase of the working chamber with the valve closed can be used to lower the temperature of the deposited layer resulting from adiabatic expansion, which can increase the rate of solidification of the film.

If evaporation is used to provide the vapor, cavitation stirring of the melt in the evaporation device can be used in combination with a system for correcting the composition of the vapor. For example, when evaporating heavy and light elements together, the vapor composition preferably is corrected because of the different agility and partial pressure of the respective elements comprising the vapor. One or more additional evaporating or inlet gas systems can be used simultaneously with the main evaporator to supply additional vapor of one or more components to raise the partial pressure of this component to correct the composition of the vapor.

In some cases the electric resistance of the vapor depends on its composition. In this instance, it is possible to control the vapor composition "in situ" by measuring the electric current between two specific electrodes under high (e.g. 500 V) voltage and correcting as described above.

This method allows production of thin films of different materials on various substrates, such as metallic and ceramic substrates and substantially avoids segregation in the heater bath and provides formation of a high homogeneity vapor composition.

When the vacuum condensation method includes evaporation of at least one solid source material, the resulting thickness, structural homogeneity, and resulting physical and chemical properties of the deposited film have been found to principally depend on the following parameters:

1. Temperature of the evaporation device;
2. Temperature of the vapor of the evaporated material;
3. Pressure and density of the evaporated material vapor;
4. Temperature and state of the substrate surface;
5. Rate of deposition of the condensed film;
6. Rate of cooling of the condensed film.

Other factors which can influence the process include the geometry and the process chamber material, as well as the specific power density of the evaporation device. The influence of each of these parameters is considered separately, using an apparatus for the production of thin films using vapor condensation, such as the apparatus shown in FIG. 1.

Referring again to FIG. 1, desired film components are typically introduced as a powder 3 inside a dosing device 110, which are introduced into the process chamber 120 through a chute 4 using a dosing needle 2. Dosing needle 2 can be controlled by an electromagnetic lever 1.

The process chamber 120 is heated by a heating device 6, such as resistive heating elements, that can be protected by a shield 7. An inert gas, such as argon, may be introduced through a pipe 5 which can be directed to the side of the substrate 12. A second inlet for an inert gas through a pipe 8 can be provided for flowing an optional gas over the deposited film. Preheated gas may also be introduced into the chamber through a pipe 21.

The substrate can be heated by a heater 11. The temperature of the substrate can be monitored by a thermocouple 13. A vacuum valve 20 is provided to allow evacuation of the reactor chamber. An external compartment 15 of the process chamber is preferably expandable and contractible to permit the volume of the process chamber to be modified. Evaporating device 17 can melt and evaporate one or more components to be deposited.

The temperature profile of the evaporation device can be adjusted to ensure a preliminary drying and outgassing of the source material. With rising vapor density, the evaporation rate can decrease. This decrease can be compensated by a corresponding temperature increase of the evaporation device. However, too sharp an increase of this temperature at the beginning of the process may lead to formation of macroscopic droplets. Macroscopic droplets generally show poor adhesion to substrates upon condensation on the substrate. However, macroscopic droplets can be useful when applied at the final step of the process since these droplets are generally of an aerosol size and condensation on the already formed film can increase the specific area of the film. Increased specific film area can be useful in battery applications because it generally enhances the electrochemical properties of the cathode or solid electrolyte material.

Figure 2:
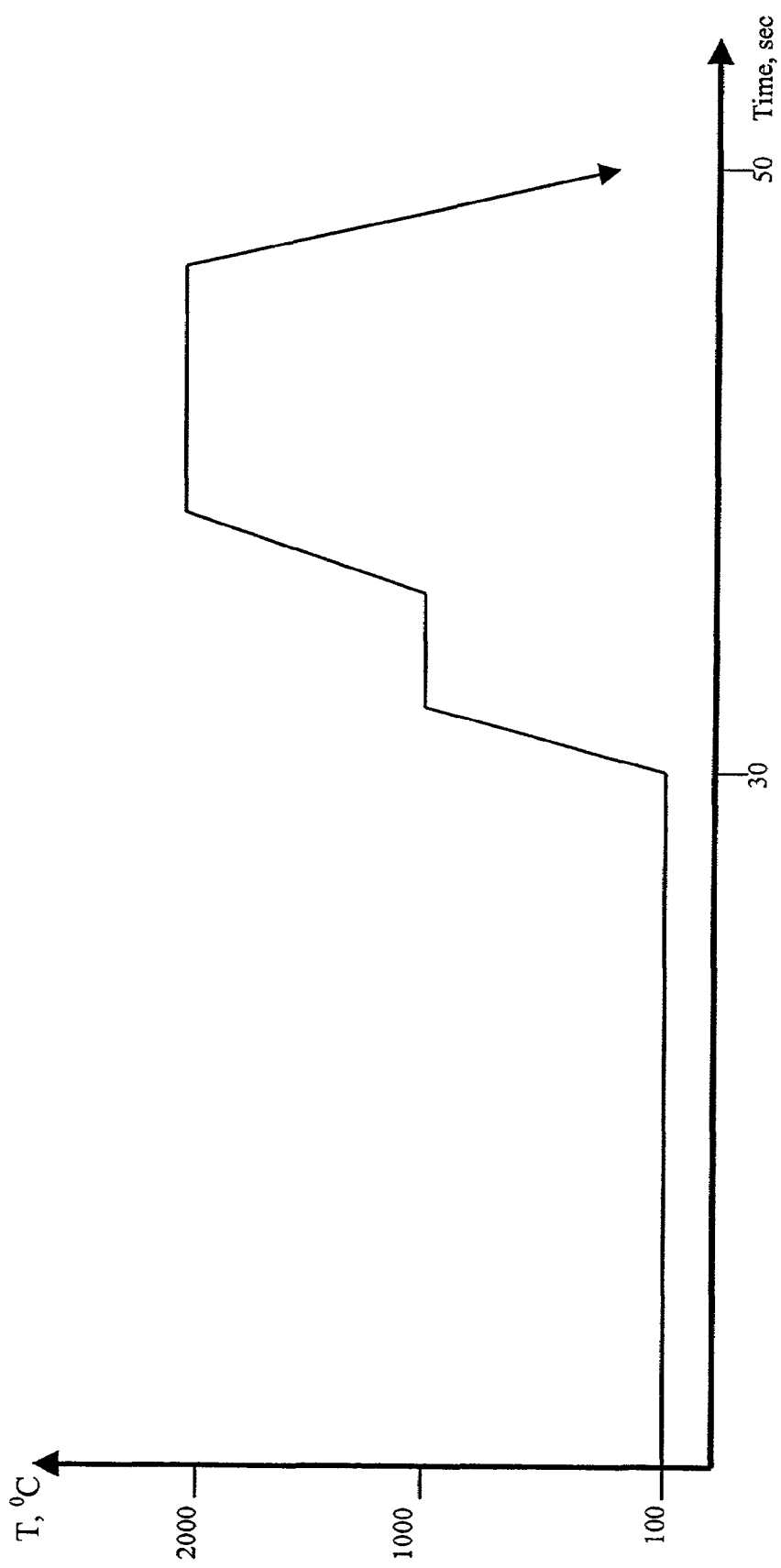
FIG. 2. illustrates a temperature profile for an evaporation device for deposition of thin films using vapor condensation suitable for use with certain electrolyte materials.

A typical temperature profile for an evaporation device suitable for evaporating most eutectic oxide, sulfide and boride systems with a melting temperature in the range of approximately 900° C. to 1000° C. is shown in FIG. 2. The temperature profile shown in FIG. 2 includes 3 stages. A first low temperature stage at 100–150° C. is a drying stage. An intermediate temperature stage at 900–1100° C. is an outgassing stage. The third stage, being at a temperature of up to 2000°, is where evaporation occurs.

The temperature of the vapor determines the kinetic energy of the vapor atoms or molecules. The equation $E=3/2kT$ relating energy of a gas and temperature should generally not be used to estimate the kinetic energy of the vapor atoms or molecules described herein as that equation generally applies well to an ideal gas, but not for a vapor. An increase in vapor temperature generally improves the adhesion of the resulting film to the substrate. However, assuming the reactor volume is held constant, increasing the temperature of the vapor during the evaporation stage influences its pressure and density. Generally, at a temperature approaching the critical temperature of the vapor in the vicinity of substrate maximizes the deposition rate and provides a highly homogeneous film.

Vapor temperatures near the evaporator and substrate are generally significantly different. This is due to the high rate of evaporation of an initial substance and a low thermal conductivity of the vapor. Because of the high rate of substance evaporation, pressure and vapor density are also variable, but generally to a lesser extent than temperature.

Thus, in the described system the vapor pressure, temperature and vapor density are different in all parts of the system. Therefore, phase diagrams are not presented.

However, approximate consideration of the proposed invention can be presented where the pressure and vapor density can be considered as constants within a volume of the system. In this case, vapor condensation without its solid phase deposition can be explained on the basis of the schematic phase diagram shown in FIG. 3.

Figure 3:
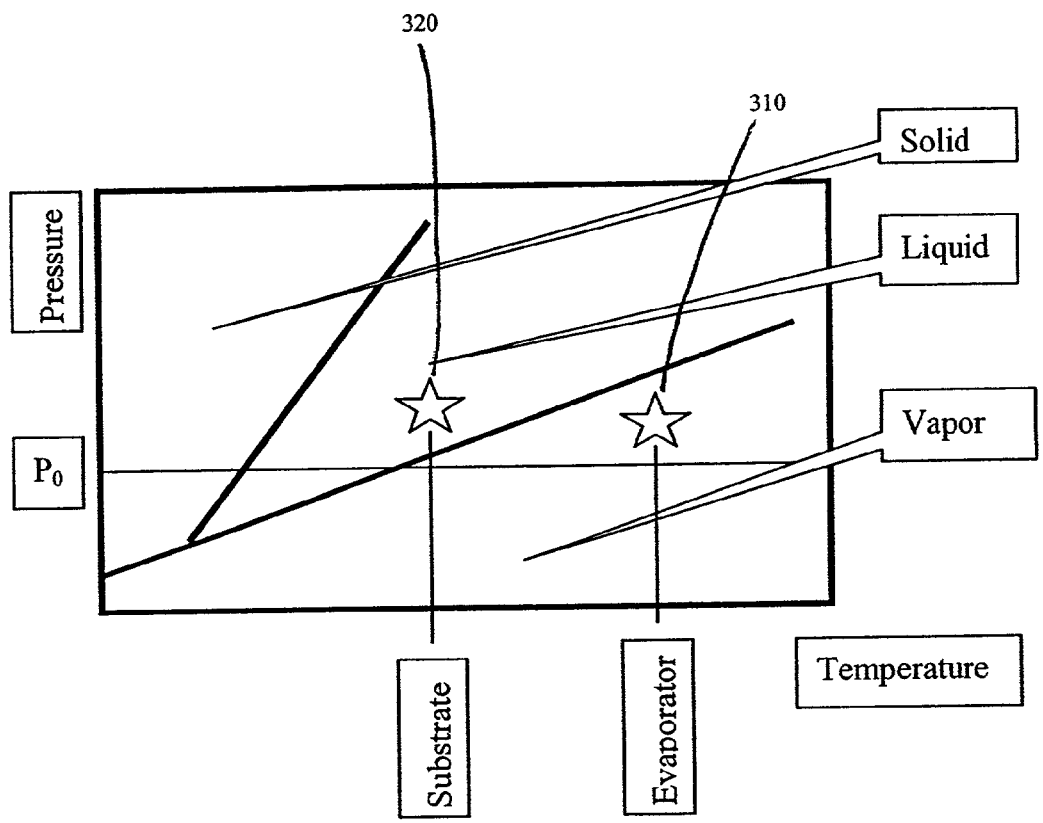
FIG. 3 illustrates the thermodynamic conditions for vapor condensation on substrates.

As shown in FIG. 3, at a constant pressure $P_o$, the substance that is near evaporator has higher temperature and is in a vapor state 310. On the other hand, near the substrate, where the substance is deposited, the temperature is lower. The phase corresponding the substrate temperature at pressure $P_o$ is located in the region of a stable liquid phase 320. Thus, the invention provides vapor condensation on the substrate.

In the invention, vapour density and associated thermodynamic parameters are determined by the evaporation rate of the starting substance and the rate of condensation on the substrate. In addition, initiation of vapor condensation on a substrate occurs at a pressure which is generally higher as compared with its equilibrium value (located on a diagram line). This likely results because in passing to condensed state the vapor has to reach the necessary degree of supersaturation.

Independent temperature control systems are preferably provided for control of the evaporator and substrate temperature. The temperature control systems are preferably computer regulated. Independent temperature control systems for the evaporator and a substrate enable the maintenance of a desired temperature distribution in a working chamber substantially independent of the rate of spraying.

Wetting properties of several materials on a variety of substrates, such as stainless steel ($Cr_{18}Ni_{10}Ti$) were investigated. It was found that most eutectic cathode oxide electrode materials are deposited on stainless steel ($Cr_{18}Ni_{10}Ti$) as a liquid film rather than discrete droplets, the thickness of which depends on the viscosity and the surface tension of the liquid at the selected substrate temperature.

Following liquid deposition, forced cooling may be used to more quickly solidify the liquid. For example, a jet of an inert gas may be used to cool the liquid deposited. The structure of the solid that is formed generally depends on the cooling rate. As the cooling rate increases, the degree of crystallinity generally decreases.

For electrode and solid electrolyte materials used in batteries, such as oxides of Mo, W, Li, B, and their eutectic compositions, at cooling rates of up to 2 K/s a crystalline structure is generally formed. An increase in the cooling rate to approximately 5 to 7 K/s generally leads to the formation of a eutectic fine-grained structure. A further increase of the cooling rate in eutectic systems of solid electrolytes leads to the formation of an amorphous-crystalline structure and a microcrystalline or mostly amorphous structure in the case of electrode materials. An amorphous-crystalline structure consists of highly dispersed crystalline phases with a broad homogeneous amorphous domain, and allows different kinds of solid solutions therein.

The invention can be used to form a thin film structure that differs from the structure of the initial source material. For example, for the deposition of solid electrolytes for batteries, the initial materials are generally eutectic compositions having a melting temperature in the range 800–1000° C. Using the invention, a condensed thin liquid film is initially formed which subsequently solidifies under controlled cooling. Controlled cooling can be provided by forced gas, such as an argon jet. The substrate temperature and the cooling rate are chosen in such a manner that an amorphous-crystalline structure is formed having an enhanced ionic conductivity at room temperature.

Such a structure can provide for a 500–1000 fold increase of the ionic conductivity of the electrolyte, which is believed to result from the formation of vacancies on the interfaces between the inserted crystalline phases in an amorphous matrix. An inserted phase increasing the conductivity of solid electrolytes has been reported in several investigations regarding mechanical mixtures of aluminum and silicon oxides and halogenides of lithium, silver and copper (Wagner Jr., J. B. in: C. A. C. Sequeira and A. Hooper, Sequeira and A. Hooper, Solid State Batteries, Matinus Nijhoff Publ. Dordrecht, 1985, p. 77). The invention can enhance this effect because of the minimization of micropores and other macrodefects. In addition, additional ion transfer along vacancies between the most closely packed faces of the crystal lattice can further enhance this effect.

Additional ion transfer is achieved primarily as a result of vacancies created in the solid electrolyte. It is known that rising temperature increases the equilibrium concentration of vacancies. During forced cooling of thin films by a jet of a cooling gas, some of the vacancies are not annihilated and remain in the final film. This generally has a positive effect on the ionic conductivity of the electrolyte film.

The cooling process can be adjusted based on desired film properties. In the case of forced gaseous cooling (e.g. Ar) to achieve thick layers, a gas can be directed toward the side of the substrate. This can prevent thermal cracking of the film. When a desired thin film requires a high cooling rate for formation of an amorphous-crystalline structure, the cooling jet can be directed to the side of the deposited film. When high thermal stresses are known to develop, the jet can be directed from both sides of the deposited film.

To reduce the time required for deposition, the deposition rate may be increased by decreasing the volume of the process chamber. The decreased process chamber volume increases the density of the vapor, which can increase the deposition rate.

A multilayer deposition of the same or different materials may be achieved by using a cyclic multistep process. For example, an evaporation device can be filled with the desired source material, the source material evaporated and the resulting vapor condensed on a substrate. The substrate can then be cooled at a rate 0.1 to 100 K/s to solidify the film. The process chamber can then be evacuated. The evaporating device can then be refilled with the same or a different source material, and the steps repeated. Alternatively, if multiple evaporating devices are provided, the refilling step would not be required.

Using a cyclic procedure, relatively thick films (e.g. >20 μm) can be produced which retain their microcrystalline or amorphous-crystalline structure compared to the one step evaporation, when a substantially crystalline structure often results from non-optimum cooling. Relatively thick films can be produced which retain their microcrystalline or amorphous-crystalline using the cyclic procedure, where only a thin layer is rapidly cooled during each cycle.

There are generally substantial difficulties in effectively cooling relatively thick films (e.g. >20 μm), obtained by a one step evaporation method, where cooling follows deposition of substantially the entire layer thickness. Because of low thermal conductivity of many materials, including most electrolyte and electrode materials, the cooling rate necessary for amorphous-crystalline structure formation is obtained only for a thin outer surface layer of the film. Inside the film, heat removal is less efficient and as a result, a crystalline (e.g. polycrystalline) structure generally forms throughout the material. During the multilayer cyclic deposition process, a plurality of cooling and deposition steps are used, cooling occurring after each thin layer deposition. As a result, cooling is much more efficient as compared to conventional cooling processes.

The vapor condensation followed by cooling produces composite film stacks (e.g. cathode/solid electrolyte) with good adhesion between the respective layers. Good intra-layer adhesion as well as inter-layer adhesion also results when interval deposition is used for one or more layers.

If a large amount of material is to be deposited using evaporation from a melt (see Example 15), it is recommended to cavitationally stir the melt, such as by using an ultrasound magnetostriction device to couple ultrasound radiation to facilitate evaporation of the material. In the experiments performed a frequency of 22 KHz was used.

Melt stirring can be helpful because the evaporation process takes place mostly from the surface of the melt. In the case of large amount of the material to be evaporated, convection in the liquid does not have sufficient time to compensate the lack of the component with the highest evaporating rate being on the surface of the melt.

For the deposition of complex multi-component electrode and electrolyte materials, if the components have low reciprocal solubility in the solid state, separate evaporation devices for each component with different evaporation temperatures are preferably used. For cyclic depositions, an adiabatic compression or expansion of the process chamber may be used during the deposition and cooling steps, respectively, in order to accelerate the procedure and to enhance heat transfer from the deposited film.

The adhesion of thin films deposited using the invention generally depends on the state of the specific substrate surface. The adhesion may be enhanced by adding a preliminary cleaning of the substrate surface prior to deposition. For example, solution cleans, ion beam and plasma treatments known in the art may be used.

A pulse deposition may be used in some cases, to produce thin films with improved surface smoothness. A pulse deposition deposits a portion of the desired layer thickness, suspends the deposition process for a period, and then deposits another layer portion. A pulsed deposition can be realized using a shutter that can isolate the evaporated vapor from the process chamber. For example, the shutter can be opened for a short time when the vapor reaches a predetermined temperature and the walls of the process chamber and the substrate reach the desired temperature. If the shutter is reasonably hermetic, the pressure increases near the heater. As a result, the flow of the depositing material becomes oriented towards the substrate.

In some applications it may be desirable to add components into the film which are not present, or are present only in small quantities in the initial source material (see Example 7). In this case, one or more gases can be introduced into the process chamber during deposition which contains the desired additional component before cooling the substrate. The gas is preferably preheated to a desired temperature, such as the temperature of the reactor chamber.

Figure 4:
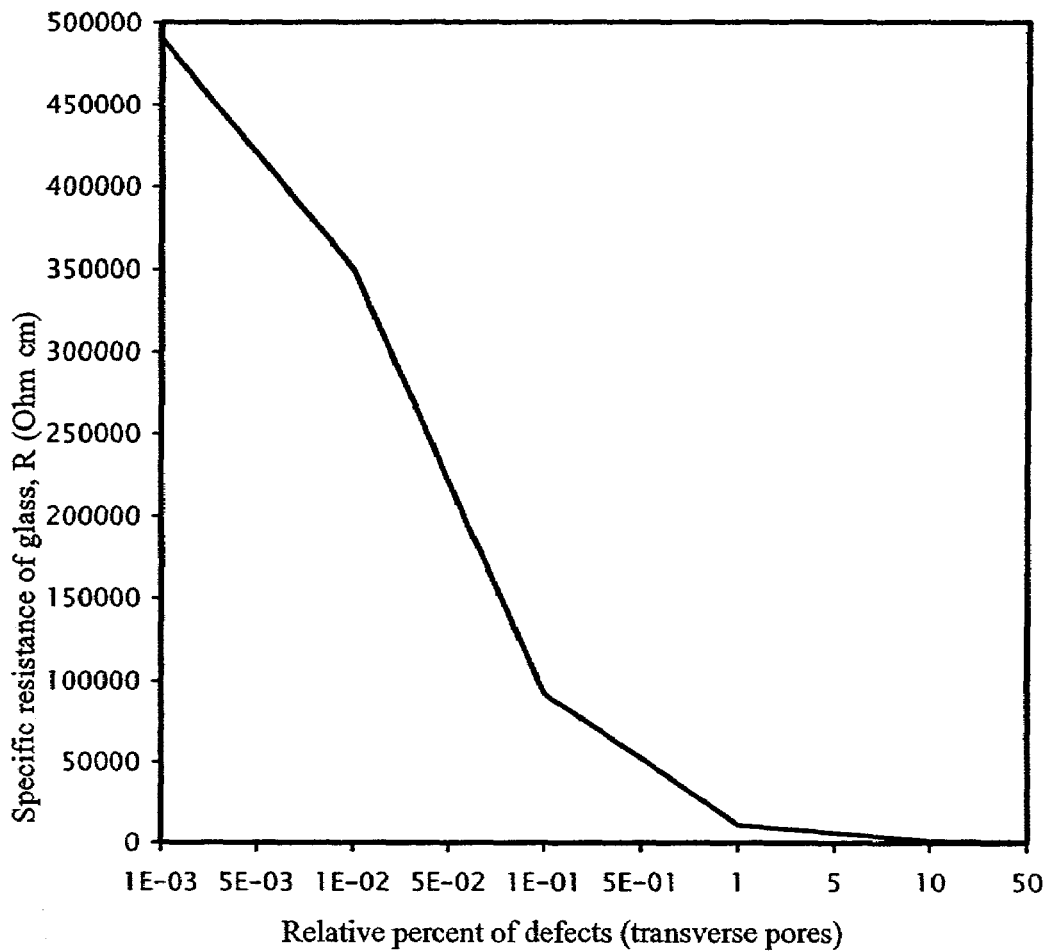
FIG. 4. illustrates the dependence of the specific electronic resistivity of a aluminum-solid electrolyte-stainless steel battery system on the level of defects in the electrolyte film.

A thin additional metallic layer such as Cu, Au, Pt, Al, Al—Li alloy or Li layer having a thickness of up to approximately 5 µm may be deposited on the surface of the deposited thin film. This layer can be used for determining properties of the layer formed from the vapor condensation process. For this purpose, the specific electrical resistivity (expressed in units of ohm-cm) between the substrate and the additional metallic layer can be measured through the film formed from the vapor condensation process. If the resistance value measured is lower than the value calculated from the specific conductivity and the geometric dimensions of the film, the presence of a film having high porosity and/or the presence of a high concentrations of defects may be indicated (see FIG. 4). Lower specific electrical resistance using the invention is believed to result because of good adhesion to solid electrolytes and cathode materials and because the deposited metals penetrate in porous micro cracks and other defects of the film. This reduces local short circuits and generally decreases the specific electric resistance of the film.

EXAMPLES

The following examples are included to demonstrate preferred embodiments of the invention. It should be appreciated by those having skill in the art that the methods and procedures disclosed in the examples which follow represent methods discovered by the inventors to function well in the practice of the invention, and thus can be considered to constitute possible modes for its practice. However, those of skill in the art should appreciate that many changes can be made in the specific embodiments which are disclosed and still obtain a like or similar result without departing from the spirit and scope of the invention.

Example 1

High Vacuum Evaporation on a Substrate Held at Room Temperature

Vitreous electrolyte of the system $Li_2O$—$Li_2SO_4$—$B_2O_3$ at a component ratio of 0.5–0.15–1 moles, respectively, in a quantity of 40 g was melted in a muffle furnace in an environment of flowing argon. After complete melting of the components at temperature 950° C., the melt was subjected to ultrasonic cavitational stirring at 22 kHz frequency for 5 minutes. Pouring was carried out on a surface of rotating rolls to obtain a homogeneous material. After pouring through the rotating rolls the solidified material forms thin flake-like particles with scales (cracked) edges. The material was then ground mechanically up to fractions less 100 µm for spraying.

Powder weight, with a mass of 40 mg was placed in the 5 cm³ volume-chamber preliminary pumped out to a high vacuum of about $10^{-6}$ torr, and was evaporated using a tungsten pipe heater under the temperature conditions shown in FIG. 2.

Spraying was carried out on a stainless steel substrate at room temperature. A thin film with the following parameters was obtained:

Thickness—4 µm,

Variation in thickness +/−1.8 µm,

Number of defects (discontinuities) determined using quantitative metallography—18%, Amorphous structure.

Figure 5:
FIG. 5. illustrates the structure of a film of the system $Li_2O$—$Li_2SO_4$—$B_2O_3$ obtained according to the procedure described in Example 1.

A large number of defects (FIG. 5) which indicate poor adhesion to a substrate and significant variation in thickness of the film did not allow determination of conductivity. This indicates application of the film formed for batteries would generally not be practical.

Example 2

Chamber Wall Temperature

Conditions described in Example 1 were again used, except the temperature of chamber walls was increased up to 600° C. A thin film having the following parameters has been obtained:

Thickness—8 µm,

Variation in thickness +/−0.2 µm,

Number of defects (discontinuities) determined using quantitative metallography—12.6%, Amorphous structure.

The higher chamber wall temperature increased the deposition efficiency. However, the conditions used did not significantly increase in film quality and adhesion to a substrate.

Example 3

Substrate Temperature

Figure 6:
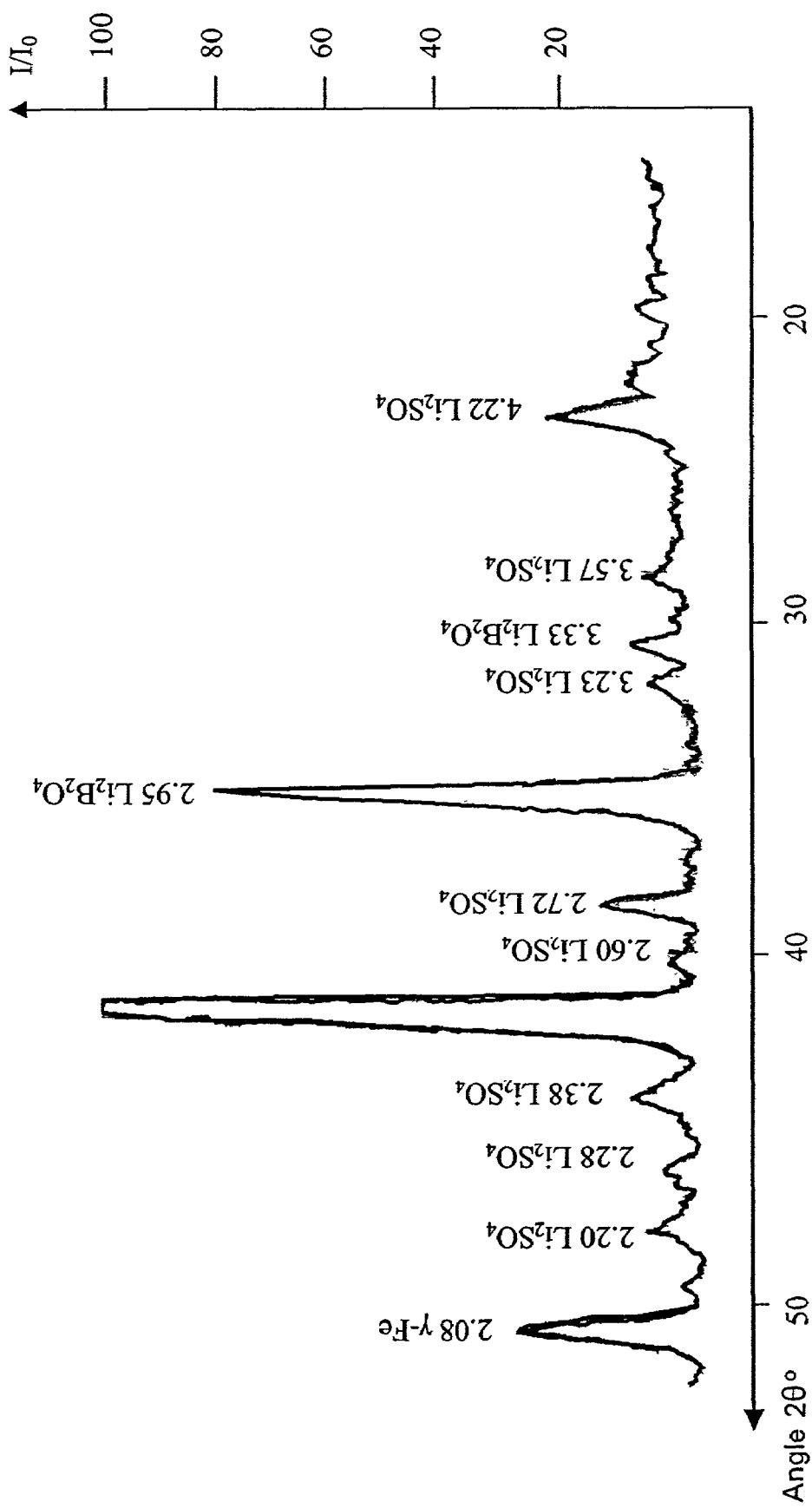
FIG. 6. illustrates an X-ray analysis of the crystalline structure of a thin film of the system $Li_2O$—$Li_2SO_4$—$B_2O_3$ obtained according to the procedure described in Example 3.

Conditions described in Example 2 were again used, except the temperature of a substrate was changed to 300° C., and the rate of film cooling after spraying was 25K/min. A thin film having the following parameters was obtained:

thickness—8 µm, variation in thickness +/−0.2 µm, number of defects (discontinuities) determined using quantitative metallography—0.6%, crystalline structure (FIG. 6) with grain size up to 50 µm.

The increase in substrate temperature did not change the deposition efficiency. However, the higher substrate temperature allowed a significant increase in the quality of the film and its adhesion to a substrate. The coarse-crystalline structure of the resulting film also limited its ionic conductivity to being about $1.1 \times 10^{-6}$ S·cm$^{-1}$.

Example 4

Substrate Cooling Rate

Conditions described in Example 3 were again used, except the rate of film cooling after spraying was increased to 150K/min. A thin film with the following parameters was obtained:

Thickness—7.2 μm

Variation in thickness +/−0.2 μm

Number of defects (discontinuities) according to the data of quantitative metallography—0.3%

Figure 7:
FIG. 7. illustrates the film structure of the system $Li_2O$—$Li_2SO_4$—$B_2O_3$ obtained according to the procedure described in Example 4.

Fine dispersion crystalline structures with the average grain size 8 μm (FIG. 7).

Increasing the rate of film cooling as compared with Example 3 did not significantly changed the efficiency of material deposition, film quality and its adhesion to a substrate. However, the increased film cooling rate has resulted in an increase in crystalline phase dispersion.

Example 5

Substrate Cooling Rate

Figure 8:
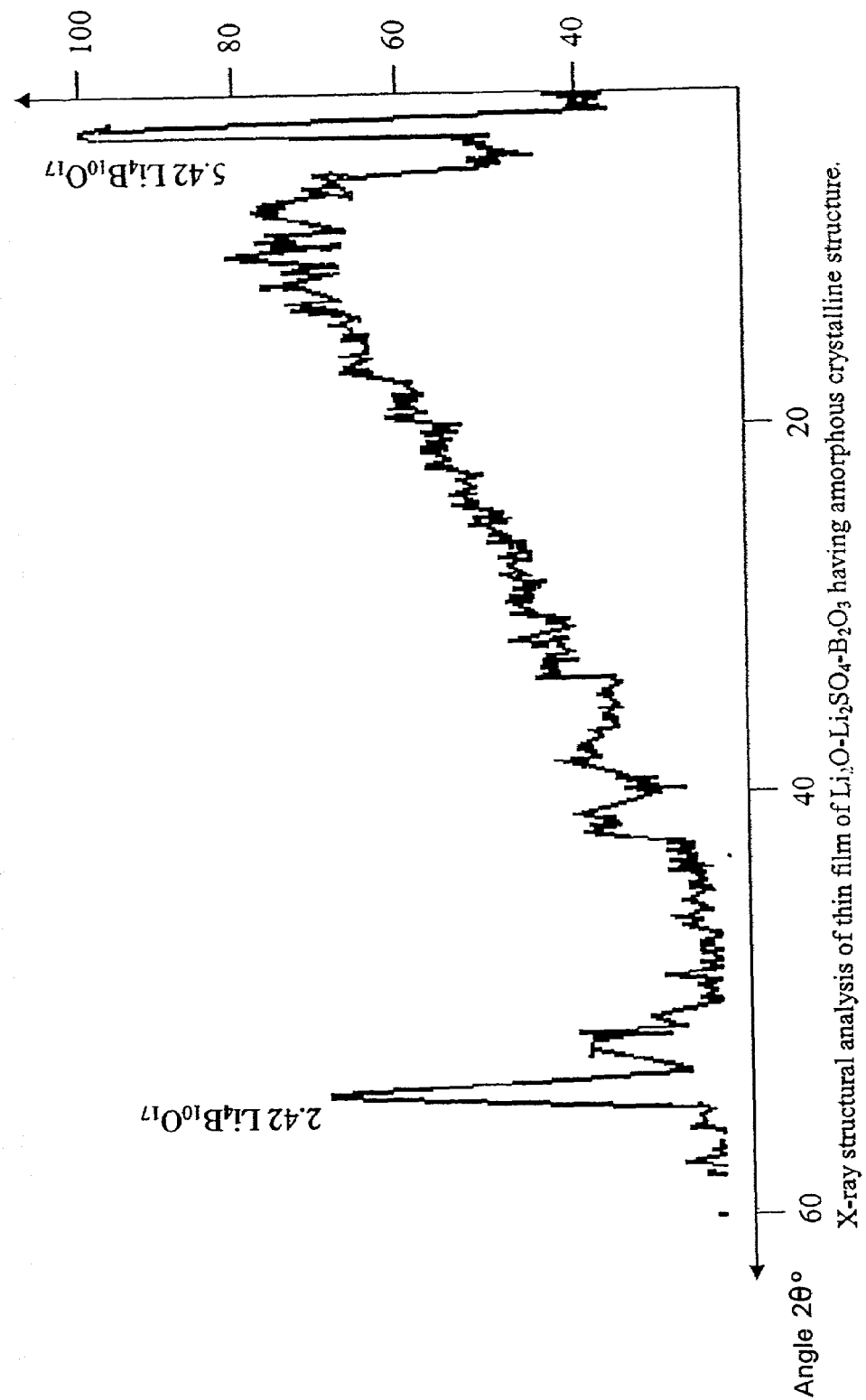
FIG. 8. illustrates an X-ray analysis of the crystal structure of a thin film of the system $Li_2O$—$Li_2SO_4$—$B_2O_3$ obtained according to the procedure described in Example 5.

Conditions described in Example 4 were again used, except the rate of film cooling after spraying was increased up to 350K/min. As a result, thin film with the following parameters has been obtained:

Thickness—7.5 μm,

Variation in thickness +\−0.2 μm,

Number of defects (discontinuities) determined using quantitative metallography—0.4%, Amorphous-crystalline structure (FIG. 8).

Increasing the rate of film cooling did not significantly change the efficiency of the material deposition, film quality, and its adhesion to the substrate. However, the higher substrate cooling rate produced an amorphous-crystalline structure which resulted in an improvement in ionic conductivity, reaching a level of $4.6 \times 10^{-4}$ S·cm$^{-1}$.

Example 6

Substrate Temperature and Vapor Density Optimization

Deposited material: $Li_2O$—$Li_2SO_4$—$B_2O_3$

Deposition Parameters:

Temperature profile of evaporating device: as indicated in FIG. 2

Amount of the used material: 140 mg

Deposition duration: 40 s (non cyclic)

Vapor density: 60 kg/m$^3$

Temperature of reactor chamber: 600° C.

Temperature of substrate: 250° C.

Parameters of The Deposited Film

Thickness of the deposited film: 6μ

Thickness nonuniformity: 4%

Ionic conductivity (from impedance measurements): $2.0 \times 10^{-3}$ S·cm$^{-1}$ Substrate diameter: 20 mm Substrate material: stainless steel $Cr_{18}Ni_{10}Ti$ after cleaning with a ionic beam.

Structure: amorphous-crystalline (see FIG. 8)

Electronic resistance at room temperature (between the substrate and additional deposited Al film: 22 kΩ

Simultaneously optimization of substrate temperature and vapor density resulted in increasing the ionic conductivity of the film without substantially changing the uniformity in composition and thickness.

Example 7

Cycling Evaporation

Deposited material: $(LiF)_2$—$Li_2WO_4$—$P_2O_5$

Deposition Parameters:

Temperature profile of evaporating device: as indicated in FIG. 2

Regime of evaporation: two cycle (cycle duration—70 s.)

Amount of used material: 120 mg per one cycle

Maximum vapor density: 80 kg/m$^3$

Temperature of reactor chamber: 600° C.

Temperature of substrate: 250° C.

Chamber volume decreasing during evaporation, and increasing during cooling—by a factor of 2.2 times Cooling procedure: argon jet from both sides Parameters of the Deposited Film:

Thickness of the deposited film: 16 μm

Thickness nonuniformity: less than 5%

Ionic conductivity (from impedance measurements): $2.6 \times 10^{-4}$ S·cm$^{-1}$ Substrate diameter: 20 mm Substrate material: stainless steel $Cr_{18}Ni_{10}Ti$ after cleaning with a ionic beam.

Structure: amorphous-crystalline (see FIG. 8)

Electronic resistance at room temperature (between the substrate and additional deposited Al film: 45 kΩ.

Example 8

Liquid Phase Formation on the Substrate

Figure 9:
FIG. 9. illustrates a SEM image of the surface of mechanically deposited powder particles of $(LiF)_2$—$Li_2WO_4$—$P_2O_5$ described in Example 8.

Solid electrolyte of the $(LiF)_2$—$Li_2WO_4$—$P_2O_5$ system obtained by the method described in Example 1 was ground up into fractions less than 20 μm and were applied in a dry manner to a stainless steel substrate. The particles were fixed on the substrate surface using compression of about 100 kg/sm$^2$. Small (up to 7–9 μm) particles of fragmental forms were confined by surface tension forces and had sufficient adhesion to a substrate. The structure of a surface having the mechanically deposited powder particles thereon is shown in the scanning electron micrograph of FIG. 9.

Example 9

Cycling Evaporation of Powder

The material having the same composition as the powder applied in the method of Example 8 was evaporated onto the substrate obtained by the method described in Example 7.

Figure 10:
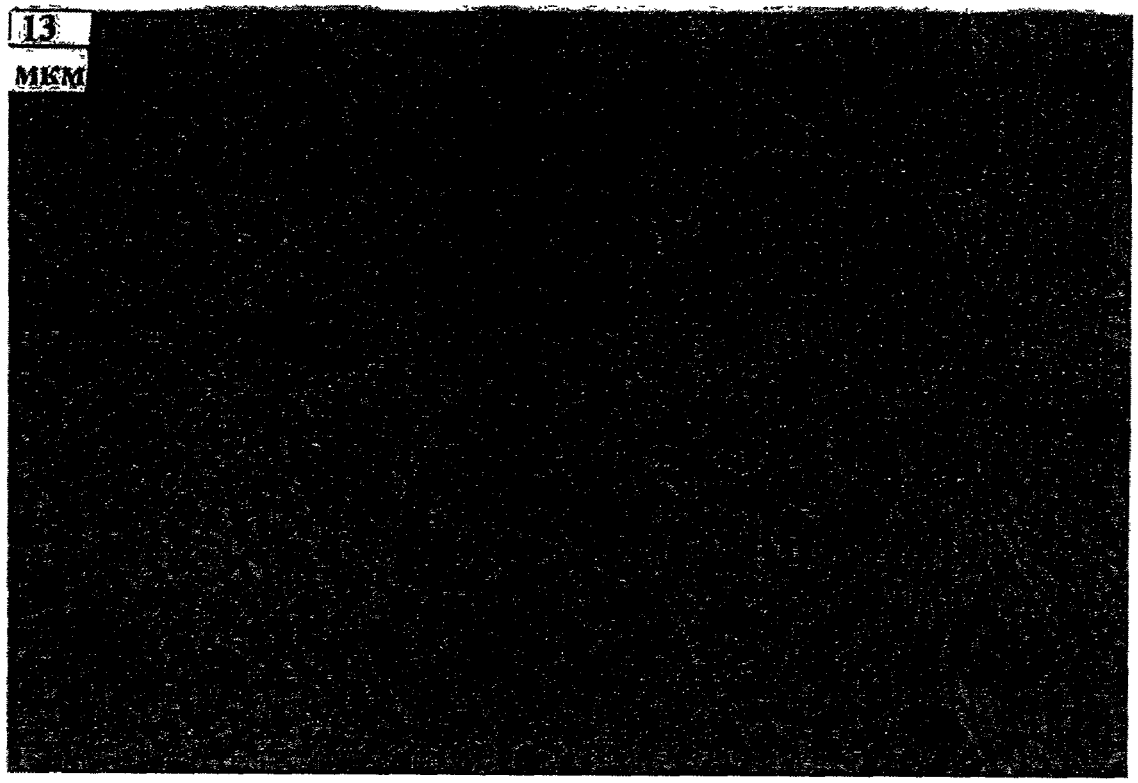
FIG. 10. illustrates a film structure of $(LiF)_2$—$Li_2WO_4$—$P_2O_5$ deposited on a substrate using the crystalline powder described in Example 9.

The analysis of structure of the obtained film (FIG. 10) was obtained by the methods of optical and scanning electron microscopy. This example showed that small fragmental particles dissolved in the evaporated layer while larger particles had modified their shape from fragmental form to round one. Such structural modifications can be explained only due to formation of liquid phase on a surface of a substrate. This liquid phase hardens during subsequent cooling.

Example 10

High Vacuum Evaporation of MoO$_3$ Cathode Material

Figure 11:
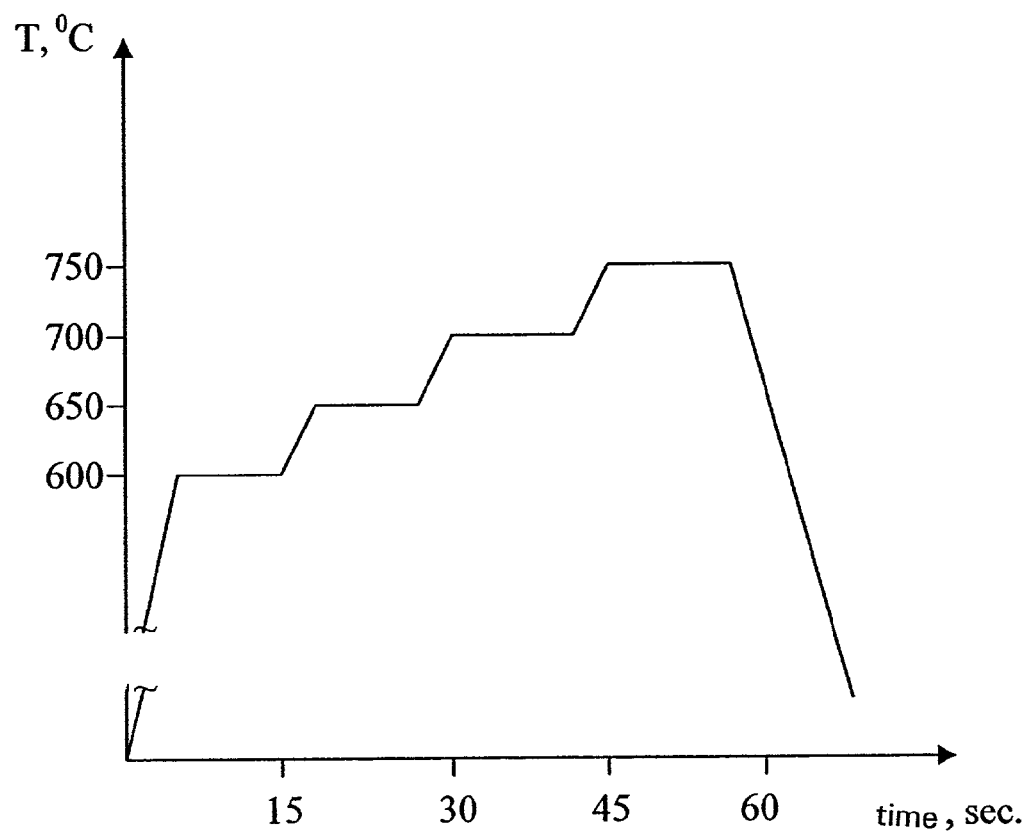
FIG. 11. illustrates the temperature profile of an evaporation device during $MoO_3$ powder evaporation.

Chemically pure powder MoO$_3$ was sprayed after 30 seconds drying at 100° C. in a closed volume under the temperature conditions shown in FIG. 11 at vapor density 40 kg/m³ in a vacuum with residual pressure 10⁻⁶ torr. The evaporation was onto a stainless steel substrate held at a temperature of 100° C. The temperature of the working area was 650° C.

Figure 12:
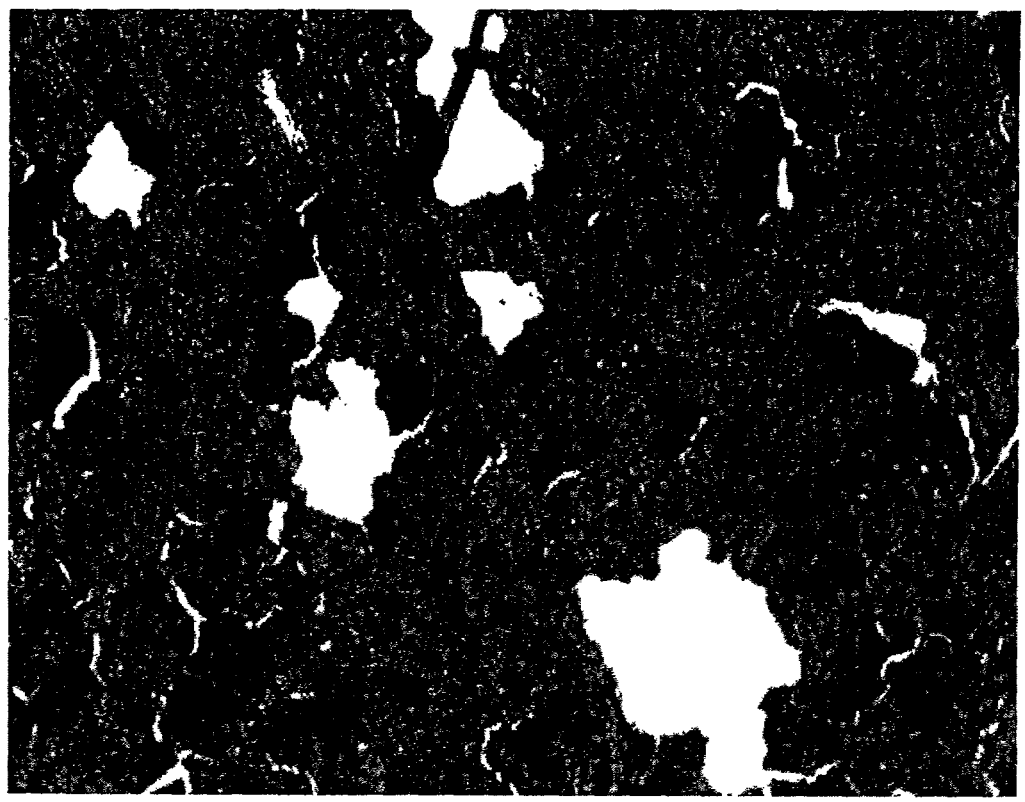
FIG. 12. illustrates $MoO_3$ film structure obtained using a deposition according to the procedure described in Example 10.

The thin (5 μm) film obtained had a considerable number of exfoliation sections from the substrate (up to 20%, see FIG. 12), that prevented resulting electrochemical characteristics to be determined.

X-ray analysis revealed a small amount of an amorphous component and oxide phases, such as $Mo_9O_{11}$. The composition obtained is not generally suitable for electrochemical applications because of larger deviation of phase composition from that of terminal oxide ($MoO_3$).

Example 11

Oxygen Added During Evaporation, Substrate and Walls Chamber Temperature Optimization, One Sided Cooling of Substrate Evaporation was made under the conditions described in Example 10, except an oxygen pressure of 0.05 torr was established in the chamber, the substrate temperature was increased to 250° C. and the temperature of working space set to 650° C. After evaporation the chamber was cooled by cold argon of high purity with the rate 4 K/sec directed at the side of the film.

Figure 13:
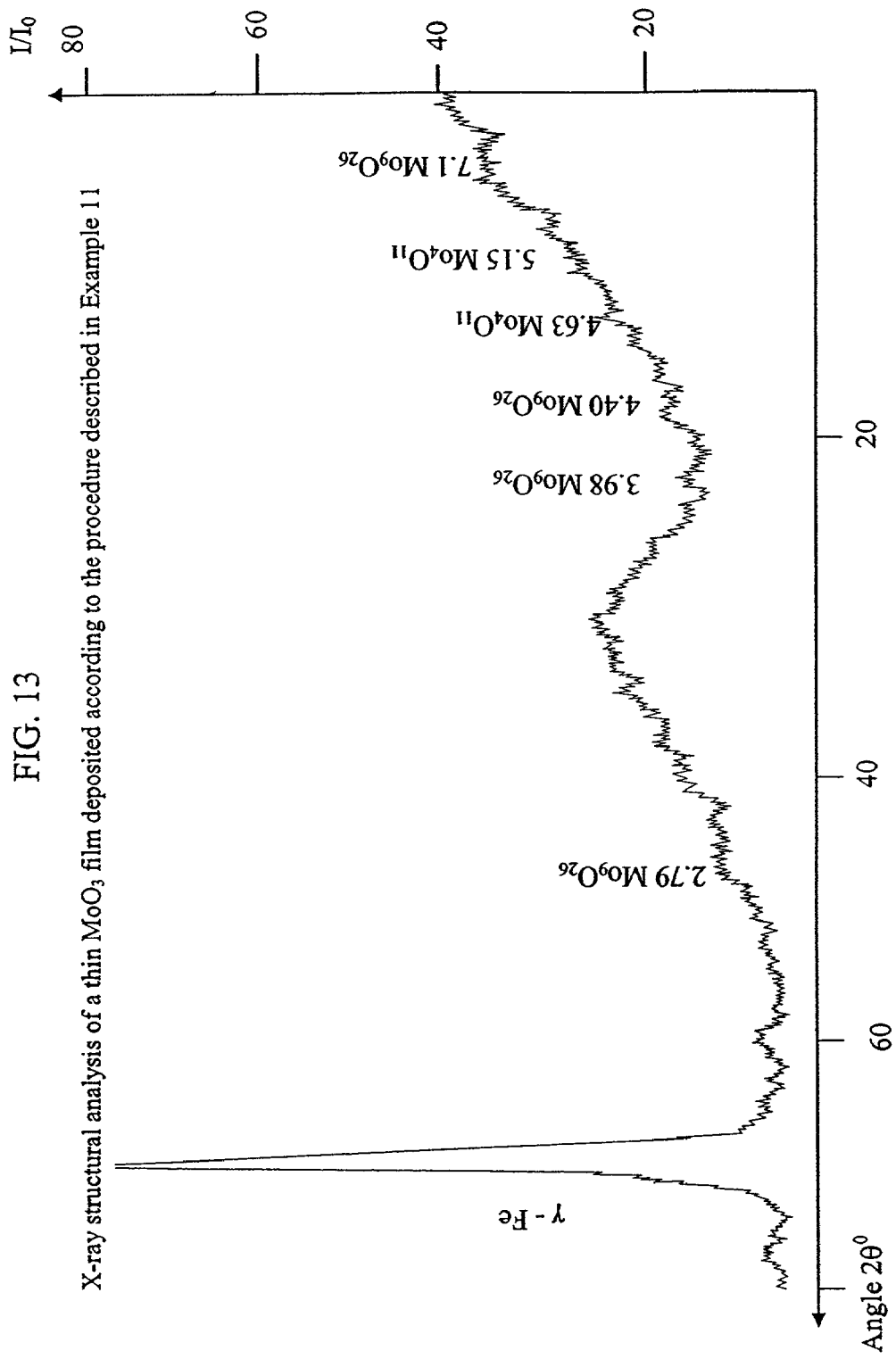
FIG. 13. illustrates an X-ray diffraction analysis of a thin $MoO_3$ film deposited according to the procedure described in Example 11.
Figure 14:
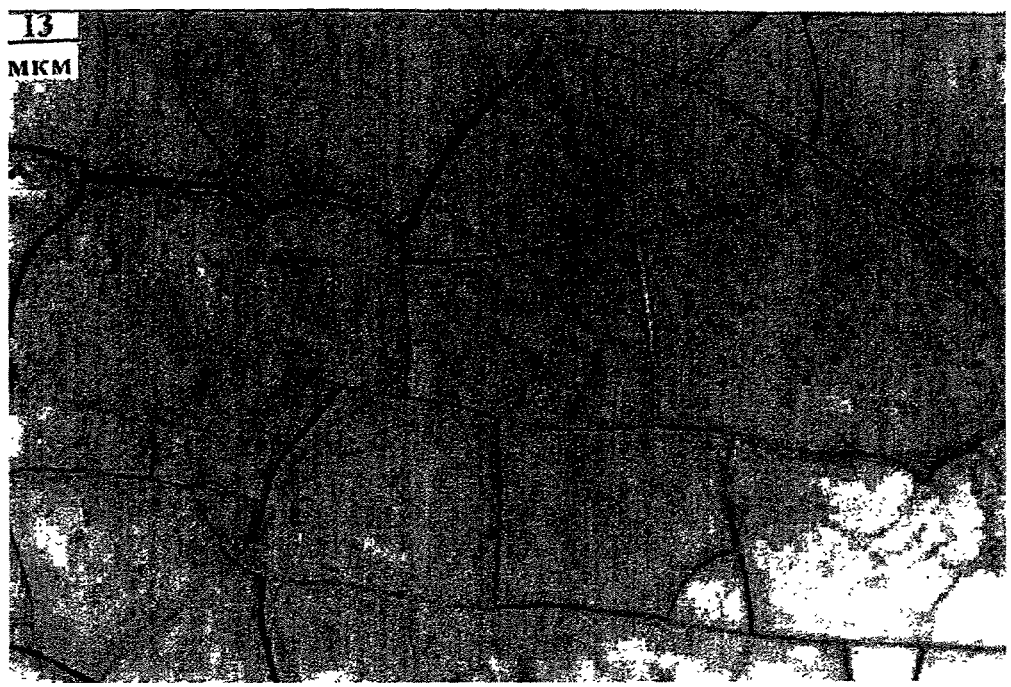
FIG. 14. illustrates a structure evidencing spalling of a $MoO_3$ film deposited according to the procedure described in Example 11.

As a result, a thin film with the following parameters has been obtained:

Thickness—7.5 μm,

Variation in thickness +\-0.4 μm,

Number of defects (discontinuities) determined using quantitative metallography—8.8%, A generally amorphous structure resulted having crystal phases $Mo_9O_{26}$ and $Mo_4O_{11}$ of no more than 6–7%(see FIG. 13). However, analysis by optical microscopy revealed considerable film spalling (FIG. 14), that negatively influenced the resulting galvanostatic characteristics shown below.

Galvanostatic Characteristics

Substrates with the thin layer of the above described cathode material of known weight were placed in a standard element 2325. One molar $LiClO_4$ in a mixture of propylene carbonate solvents and dimethoxyethane in a ratio of 3 to 1 was used as the electrolyte. A lithium anode and microporous polypropylene separator were also provided. Charge-discharge cell characteristics were investigated using an automatic cycling stand with computer control. Cycling range of the system was 1.1–3.5 V, discharge current −25 μA/cm², charging current was 12.5 μA/cm².

The specific capacity of the cathode material was determined to be 50 mA·h/gr (14% of theoretical), having no ability for reversible work.

Example 12

Both Inner and Outside Cooling of the Substrate

Spraying was carried out under the conditions described in Example 11. However cooling was directed to both the substrate and the film.

Figure 15:
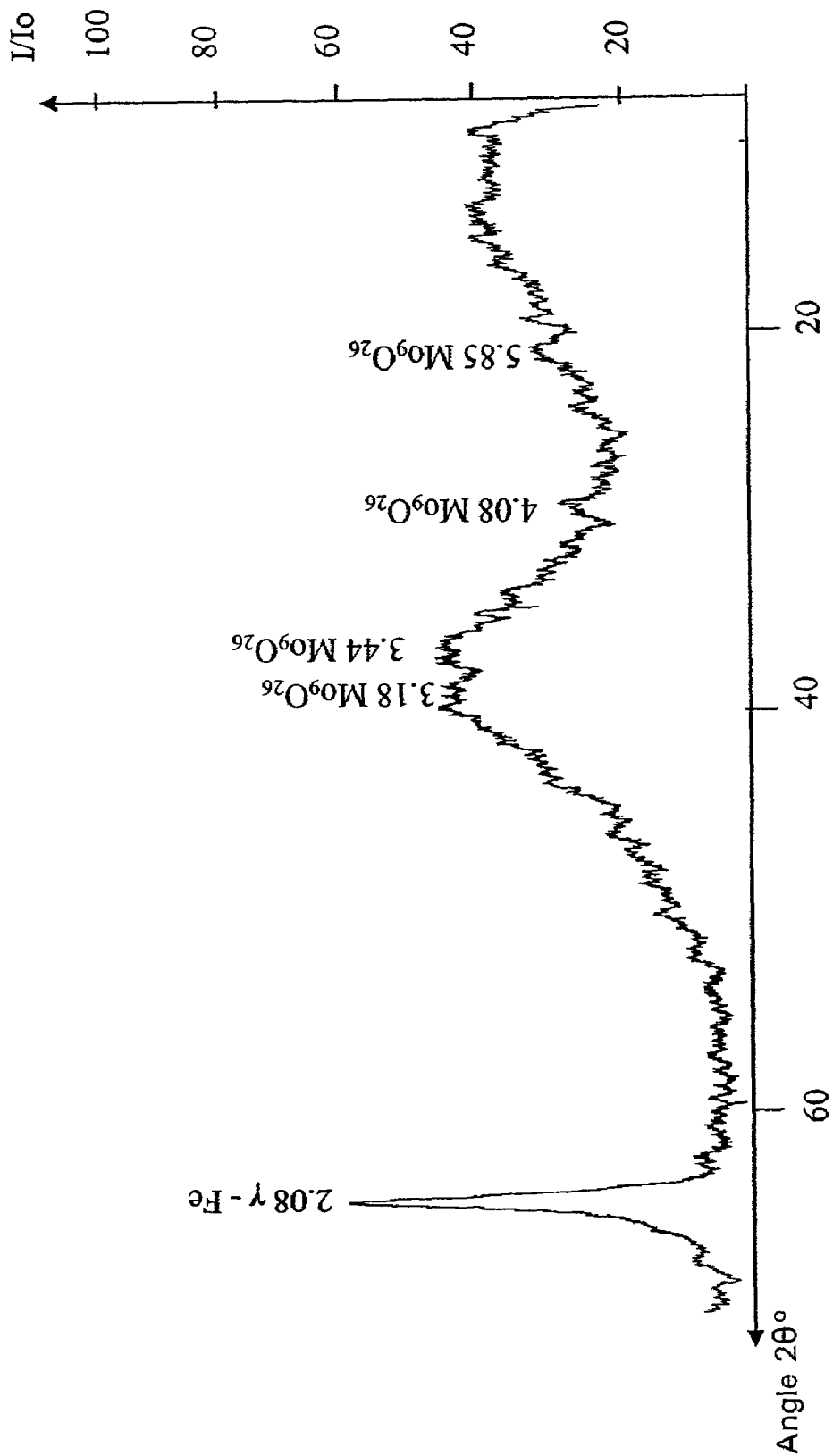
FIG. 15. illustrates an X-ray diffraction analysis of a thin $MoO_3$ film deposited according to the procedure described in Example 12.
Figure 16:
FIG. 16. illustrates a $MoO_3$ film not evidencing spalling deposited according to the procedure described in Example 12.
Figure 17:
FIG. 17. illustrates the fine structure of $MoO_3$ film deposited according to the procedure described in Example 12.

As a result, thin film with the following parameters were obtained:

Thickness—6.0 μm,

Variation in thickness +/−0.4 μm,

Number of defects (discontinuities) according to the data of quantitative metallography—0.4%, Rate of film cooling—3 K/s, Amorphous structure with the contents of crystal phase $Mo_9O_{26}$ of no more than 7–8% (FIG. 15). Film spalling was not found in an analysis by optical microscopy performed (FIG. 16). Detailed analyses of the crystalline phase by the method of scanning electron microscopy (FIG. 17) revealed the crystallites were dispersed, less than 25–40 nm in thickness, and showed a plate-like morphology (FIG. 17).

The method described in this example provided improved galvanostatic characteristics as determined by the technique described in Example 11. Resulting galvanostatic characteristics included a specific capacity of a cathode material of 270 mA·h/gr, (75% of theoretical), and reversible work ability. These characteristics are considered satisfactory for electrochemical applications.

Example 13

Multi-Layer (Cathode—Solid Electrolyte) Thin Films

In this example, a $Li_2O$—$Li_2SO_4$—$B_2O_3$ electrolyte was evaporated onto a $MoO_3$ cathode. Spraying was performed under the conditions described in Example 12, except solid electrolyte of the $Li_2O$—$Li_2SO_4$—$B_2O_3$ system at a component ratio of 0.5–0.15–1 moles was evaporat onto the surface $MoO_3$ under the conditions of Example 6. Morphological and structural characteristics of the films of the cathode and electrolyte materials corresponded to Example 12 and 6, respectively.

Resulting Parameters of the Films:

Total conductance of the electrolyte (from impedance measurements): $2.9 \times 10^{-4}$ S·cm⁻¹

Diameter of the substrate: 20 mm

Structure of the electrolyte: amorphous-crystalline

Structure of the cathode: amorphous containing not more than 8% of crystalline phases of the type $Mo_9O_{26}$.

Measurement of the galvanostatic characteristics by the method of Example 12 showed that the specific capacity of the cathode material was 330 mA·h/gr (92% of theoretical), with capability to reversible work. These characteristics are considered satisfactory for electrochemical applications.

Example 14

Process and Condition of Co-Evaporation

Thin film from the material and by the process desribed in Example 4 was obtained, except 10 mg $B_2O_3$ was sprayed from additional evaporator simultaneously with evaporation the main electrolyte component $Li_2O$—$Li_2SO_4$—$B_2O_3$. The evaporation of $B_2O_3$ was performed according the temperature regime shown in FIG. 2, except the outgassing stage temperature used was 500° C.

An amorphous-crystalline structure shown in FIG. 8 was substantially obtained. This resulting structural characteristic produces electrolytes having improved ionic conductivity (see Example 5).

Example 15

A large Amount of Material for Evaporation Aided by Ultrasound Stirring

A $(LiF)_2$—$Li_2WO_4$—$P_2O_5$ film with the thickness 18 μm was obtained using the Example 1 process conditions and apparatus, except as noted below.

Figure 18:
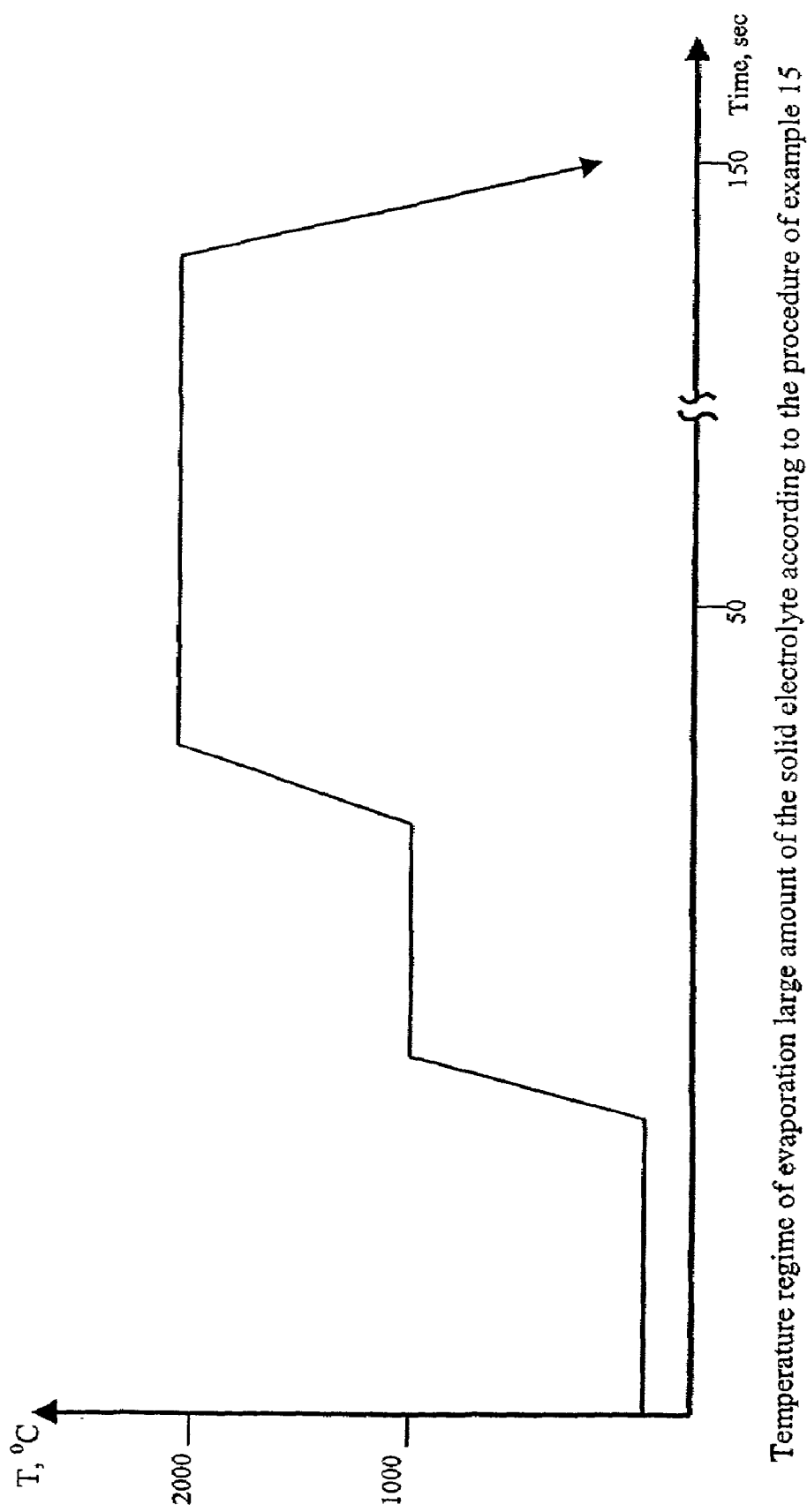
FIG. 18. illustrates a temperature profile of an evaporation device for evaporation of a large amount of material according to the procedure described in Example 15.

The amount of the material for evaporation was 300 mg. The time of evaporation was increased to 150 seconds (FIG. 18).

Microprobe analyses revealed the concentration of W in the film compared with the concentration in initial solid material.

The experiment was repeated without changing conditions, but the melt in the heater was stirred using an ultrasound magnetostriction device operated at a frequency of 22 KHz. The difference in W concentration between the evaporation source material and the solid layer formed from vapor condensation was less than 1.0%, as shown in following table below:

| Material | % W |
| --- | --- |
| Initial $(LiF)_2$—$Li_2WO_4$—$P_2O_5$ powder | 61.2 |
| Film deposited without stirring | 44.0 |
| Film deposited with stirring | 60.3 |

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

We claim:

1. A method for depositing a thin film, comprising:
   a) heating a solid state material having a chemical composition to a temperature above a boiling point of said material to form a vapor in an evaporation device, wherein said vapor is directed inside an evacuated process chamber having a pair of members;
   b) condensing said vapor onto a substrate in said evacuated process chamber to form a liquid phase deposit, said liquid phase deposit having said chemical composition of said solid state material, wherein a temperature of said substrate is lower than the condensation temperature of said vapor and wherein a temperature of said evaporation device exceeds a temperature of said substrate by at least 500° C.;
   c) cooling said liquid deposit to form a solid phase film, wherein a chemical composition of solid state film includes said chemical composition of said solid state material; and
   d) cyclically and adiabatically varying the volume of said evacuated process chamber by expanding and contracting said members relative one and the other thereby increasing and decreasing the volume of said evacuated process chamber to increase and decrease the density of said vapor as said members are contracted relative one and the other.

2. The method of claim 1, wherein said temperature of said substrate is less than or equal to 300° C.

3. The method of claim 1, wherein a pressure of said vapor near said evaporator device is at least $7.55 \times 10^5$ Pa.

4. The method of claim 1, further comprising multistep cycling, said multistep cycling comprising a plurality of separate cycles where only a portion of said solid phase film is deposited during each cycle, said cycles each including said heating, condensing and cooling steps.

5. The method of claim 4, wherein said solid phase film comprises a first layer disposed on a second layer, said first and second layers being chemically distinct and not chemically interacting.

6. The method of claim 5, wherein said first layer is a cathode layer and said second layer is a solid electrolyte layer.

7. The method of claim 1, wherein said solid phase file comprises a eutectic composition, said eutectic composition comprising a plurality of said chemical compositions.

8. The method of claim 7, wherein said heating step comprises melting a plurality of said solid state materials to form a homogeneous material and evaporating said homogeneous material to form said solid phase eutectic film on said substrate.

9. The method of claim 1, wherein said substrate is metallic or ceramic.

10. The method of claim 1, wherein said cooling step comprises active cooling, said active cooling injecting inert gas directly into an internal volume of said process chamber.

11. The method of claim 10, wherein a cooling rate of said substrate is controlled to a predetermined cooling rate, said cooling rate being from 25K to 350K/mm.

12. The method of claim 1, wherein said solid phase film comprises at least one selected from the group consisting of an oxide, a boride, a sulfide and a fluoride.

13. The method of claim 1, wherein said heating step comprises utilizing a plurality of evaporation sources, wherein respective ones of said vapor obtained from said evaporation sources do not chemical interact.

14. The method of claim 13, wherein said plurality of evaporation sources are operated at different temperatures.

15. A method for depositing a thin film, comprising:
   a) heating a solid state material having a chemical composition to a temperature above a boiling point of said material to form a vapor in an evaporation device, wherein said vapor is directed inside an evacuated process chamber, wherein a pressure of said vapor near said evaporator device is at least $7.55 \times 10^5$ Pa;
   b) condensing said vapor onto a substrate in said evacuated process chamber to form a liquid phase deposit, said liquid phase deposit having said chemical composition of said solid state material, wherein a temperature of said substrate is lower than the condensation temperature of said vapor;
   c) cooling said liquid deposit to form a solid phase film, wherein a chemical composition of solid state film includes a chemical composition of said solid state material; and
   d) cyclically and adiabatically varying the volume of said evacuated process chamber by expanding and contracting said evacuated process chamber thereby increasing and decreasing the volume of said evacuated process chamber to increase and decrease the density of said vapor as said evacuated process chamber is contracted relative one and the other.

16. The method of claim 15, wherein said temperature of said substrate is less than or equal to 300° C.

17. The method of claim 15, wherein the step of cyclically and adiabatically varying the volume is further defined by expanding and contracting a pair members of said evacuated process chamber relative to one another thereby adiabatically varying the volume of said evacuated process chamber.

18. The method of claim 15, further comprising multistep cycling, said multistep cycling comprising a plurality of separate cycles where only a portion of said solid phase film is deposited during each cycle, said cycles each including said heating, condensing and cooling steps.

19. The method of claim 18, wherein said solid phase film comprises a first layer disposed on a second layer, said first and second layers being chemically distinct and not chemically interacting.

20. The method of claim 19, wherein said first layer is a cathode layer and said second layer is a solid electrolyte layer.

21. The method of claim 15, wherein said solid phase film comprises a eutectic composition, said eutectic composition comprising a plurality of said chemical compositions.

22. The method of claim 21, wherein said heating step comprises melting a plurality of said solid state materials to form a homogeneous material and evaporating said homogeneous material to form said solid phase eutectic film on said substrate.

23. The method of claim 15, wherein said substrate is metallic or ceramic.

24. The method of claim 15, wherein said cooling step comprises active cooling, said active cooling injecting inert gas directly into an internal volume of said process chamber.

25. The method of claim 15, wherein said solid phase film comprises at least one selected from the group consisting of an oxide, a boride, a sulfide and a fluoride.

26. The method of claim 15, wherein said heating step comprises utilizing a plurality of evaporation sources, wherein respective ones of said vapor obtained from said evaporation sources do not chemical interact.

27. The method of claim 26, wherein said plurality of evaporation sources are operated at different temperatures.

* * * * *

UNITED STATES PATENT AND TRADEMARK OFFICE
CERTIFICATE OF CORRECTION

PATENT NO. : 7,208,195 B2  
APPLICATION NO. : 10/108140  
DATED : April 24, 2007  
INVENTOR(S) : Yevgen Kalynushkin et al.

Page 1 of 1

It is certified that error appears in the above-identified patent and that said Letters Patent is hereby corrected as shown below:

Column 17, line 52, please delete "," between "C" and ";".

Column 18, line 28, please delete "mm" and insert --min.--.

Signed and Sealed this

Sixteenth Day of October, 2007

JON W. DUDAS  
*Director of the United States Patent and Trademark Office*